(12) United States Patent
Tsukamoto et al.

(10) Patent No.: US 8,207,476 B2
(45) Date of Patent: Jun. 26, 2012

(54) TEMPERATURE CONTROLLED SUBSTRATE HOLDER WITH NON-UNIFORM INSULATION LAYER FOR A SUBSTRATE PROCESSING SYSTEM

(75) Inventors: Yuji Tsukamoto, Wilmington, MA (US); Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 142 days.

(21) Appl. No.: 12/631,278

(22) Filed: Dec. 4, 2009

(65) Prior Publication Data
US 2010/0078424 A1    Apr. 1, 2010

Related U.S. Application Data

(63) Continuation of application No. 11/525,815, filed on Sep. 25, 2006, now Pat. No. 7,723,648.

(51) Int. Cl.
*H05B 1/02* (2006.01)
*H05B 3/68* (2006.01)
*F27B 5/06* (2006.01)
*F27B 5/18* (2006.01)

(52) U.S. Cl. ............ 219/390; 219/444.1; 219/494; 118/724; 118/728

(58) Field of Classification Search ............ None
See application file for complete search history.

(56) References Cited

U.S. PATENT DOCUMENTS

| | | | |
|---|---|---|---|
| 5,290,381 A * | 3/1994 | Nozawa et al. | 156/345.27 |
| 5,567,267 A * | 10/1996 | Kazama et al. | 156/345.27 |
| 5,667,622 A | 9/1997 | Hasegawa et al. | |
| 6,222,161 B1 * | 4/2001 | Shirakawa et al. | 219/390 |
| 6,239,402 B1 | 5/2001 | Araki et al. | |
| 6,264,788 B1 * | 7/2001 | Tomoyasu et al. | 156/345.43 |
| 6,406,545 B2 | 6/2002 | Shoda et al. | |
| 6,414,276 B1 | 7/2002 | Babikian | |
| 6,472,643 B1 | 10/2002 | Babikian | |
| 6,566,632 B1 | 5/2003 | Katata et al. | |
| 6,847,014 B1 | 1/2005 | Benjamin et al. | |
| 6,921,724 B2 | 7/2005 | Kamp et al. | |
| 7,025,858 B2 * | 4/2006 | Chou | 156/345.51 |
| 7,252,738 B2 * | 8/2007 | Tong et al. | 156/345.29 |
| 7,274,004 B2 | 9/2007 | Benjamin et al. | |
| 7,297,894 B1 * | 11/2007 | Tsukamoto et al. | 219/121.58 |

(Continued)

FOREIGN PATENT DOCUMENTS

CN        1529994 A    9/2004

(Continued)

OTHER PUBLICATIONS

CN Office Action (with English translation) dated Nov. 30, 2011 in corresponding Chinese Application No. 2007-80035454.0.

*Primary Examiner* — Joseph M Pelham
(74) *Attorney, Agent, or Firm* — Oblon, Spivak, McClelland, Maier & Neustadt, L.L.P.

(57) ABSTRACT

A substrate holder for supporting a substrate in a processing system includes a temperature controlled support base having a first temperature, and a substrate support opposing the temperature controlled support base and configured to support the substrate. Also included is one or more heating elements coupled to the substrate support and configured to heat the substrate support to a second temperature above the first temperature, and a thermal insulator disposed between the temperature controlled support base and the substrate support. The thermal insulator includes a non-uniform spatial variation of the heat transfer coefficient (W/m²-K) through the thermal insulator between the temperature controlled support base and the substrate support.

18 Claims, 9 Drawing Sheets

U.S. PATENT DOCUMENTS

| | | | |
|---|---|---|---|
| 7,311,797 B2 * | 12/2007 | O'Donnell et al. | 156/345.51 |
| 7,544,251 B2 * | 6/2009 | Holland et al. | 118/724 |
| 7,554,059 B2 | 6/2009 | Awazu et al. | |
| 7,557,328 B2 * | 7/2009 | Ohata | 219/497 |
| 2003/0089457 A1 | 5/2003 | Nallan et al. | |
| 2005/0029244 A1 * | 2/2005 | Ito et al. | 219/444.1 |
| 2005/0173403 A1 * | 8/2005 | Benjamin et al. | 219/444.1 |
| 2005/0173404 A1 * | 8/2005 | Benjamin et al. | 219/444.1 |
| 2006/0102613 A1 | 5/2006 | Kuibira et al. | |
| 2011/0011845 A1 * | 1/2011 | Tsukamoto | 219/468.1 |

FOREIGN PATENT DOCUMENTS

| | | |
|---|---|---|
| JP | 10-83960 | 3/1998 |
| JP | 2000-269189 | 9/2000 |

* cited by examiner

TEMPERATURE CONTROLLED SUBSTRATE HOLDER WITH NON-UNIFORM INSULATION LAYER FOR A SUBSTRATE PROCESSING SYSTEM

CROSS-REFERENCE TO RELATED APPLICATIONS

This application is a continuation of co-pending U.S. Ser. No. 11/525,815, filed Sep. 25, 2006, which is related to U.S. Pat. No. 7,230,204, issued on Jun. 12, 2007, entitled "Method and System for Temperature Control of a Substrate"; co-pending U.S. patent application Ser. No. 11/525,818, filed on Sep. 25, 2006, entitled "High Temperature Substrate Holder for a Substrate Processing System"; U.S. Pat. No. 7,297,894, issued on Nov. 20, 2007, entitled "Method for Multi-step Temperature Control of a Substrate"; and U.S. Pat. No. 7,557,328, issued on Jul. 7, 2009 entitled "High Rate Method for Stable Temperature Control of a Substrate." The entire contents of these applications are herein incorporated by reference in their entirety.

BACKGROUND OF THE INVENTION

1. Field of the Invention

The present invention relates to a system for temperature control of a substrate, and more particularly to a substrate holder for temperature control of a substrate.

2. Description of Related Art

It is known in semiconductor manufacturing and processing that various processes, including for example etch and deposition processes, depend significantly on the temperature of the substrate. For this reason, the ability to control the temperature of a substrate and controllably adjust the temperature of the substrate is becoming an essential requirement of a semiconductor processing system. The temperature of a substrate is determined by many processes including, but not limited to, substrate interaction with plasma, chemical processes, etc., as well as radiative and/or conductive thermal exchange with the surrounding environment. Providing a proper temperature to the upper surface of the substrate holder can be utilized to control the temperature of the substrate.

SUMMARY OF THE INVENTION

The present invention relates to a system for controlling the temperature of a substrate.

According to one aspect of the invention, a substrate holder for supporting a substrate in a processing system includes a temperature controlled support base having a first temperature, and a substrate support opposing the temperature controlled support base and configured to support the substrate. Also included is one or more heating elements coupled to the substrate support and configured to heat the substrate support to a second temperature above the first temperature, and a thermal insulator disposed between the temperature controlled support base and the substrate support. The thermal insulator includes a non-uniform spatial variation of the heat transfer coefficient (W/m²-K) through the thermal insulator between the temperature controlled support base and the substrate support.

According to another aspect of the invention, a substrate holder for supporting a substrate in a processing system includes a temperature controlled support base having a first temperature, and a substrate support opposing the temperature controlled support base and configured to support the substrate. one or more heating elements are coupled to the substrate support and configured to heat the substrate support to a second temperature above the first temperature. Also included is means for providing a non-uniform spatial variation of the heat transfer co-efficient (W/m²-K) between the temperature controlled support base and the substrate support.

DETAILED DESCRIPTION OF EXEMPLARY EMBODIMENTS

In the following description, for purposes of explanation and not limitation, specific details are set forth, such as a particular geometry of the substrate holder for a substrate processing system and descriptions of various components and processes. However, it should be understood that the invention may be practiced in other embodiments that depart from these specific details.

Figure 1:
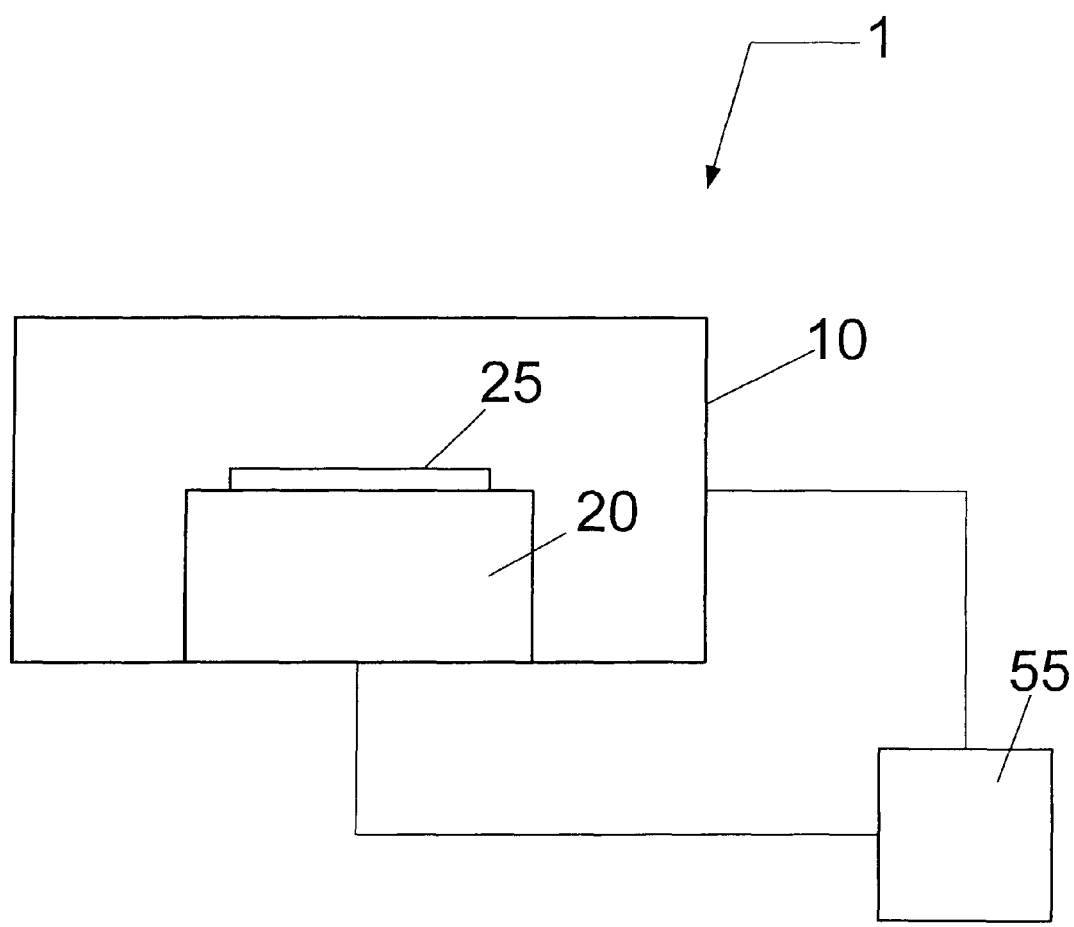
FIG. 1 presents a block diagram of a substrate processing system according to an embodiment of the present invention.

According to an embodiment of the present invention, a material processing system 1 is depicted in FIG. 1 that includes a process tool 10 having a substrate holder 20 and a substrate 25 supported thereon. The substrate holder 20 is configured to provide temperature control elements for adjustment of substrate temperature. Additionally, the temperature control elements may be spatially arranged in order to ensure a uniform or non-uniform substrate temperature. A controller 55 is coupled to the process tool 10 and the substrate holder 20, and is configured to monitor, adjust and control the substrate temperature as will be further discussed below.

In the illustrated embodiment depicted in FIG. 1, the material processing system 1 can include an etch chamber. For example, the etch chamber can facilitate dry plasma etching, or, alternatively, dry non-plasma etching. Alternately, the material processing system 1 includes a photo-resist coating chamber such as a heating/cooling module in a photo-resist spin coating system that may be utilized for post-adhesion bake (PAB) or post-exposure bake (PEB), etc.; a photo-resist patterning chamber such as a photo-lithography system; a dielectric coating chamber such as a spin-on-glass (SOG) or spin-on-dielectric (SOD) system; a deposition chamber such as a vapor deposition system, chemical vapor deposition (CVD) system, plasma enhanced CVD (PECVD) system, atomic layer deposition (ALD) system, plasma enhanced ALD (PEALD) system, or a physical vapor deposition (PVD) system; or a rapid thermal processing (RTP) chamber such as a RTP system for thermal annealing.

Figure 2A:
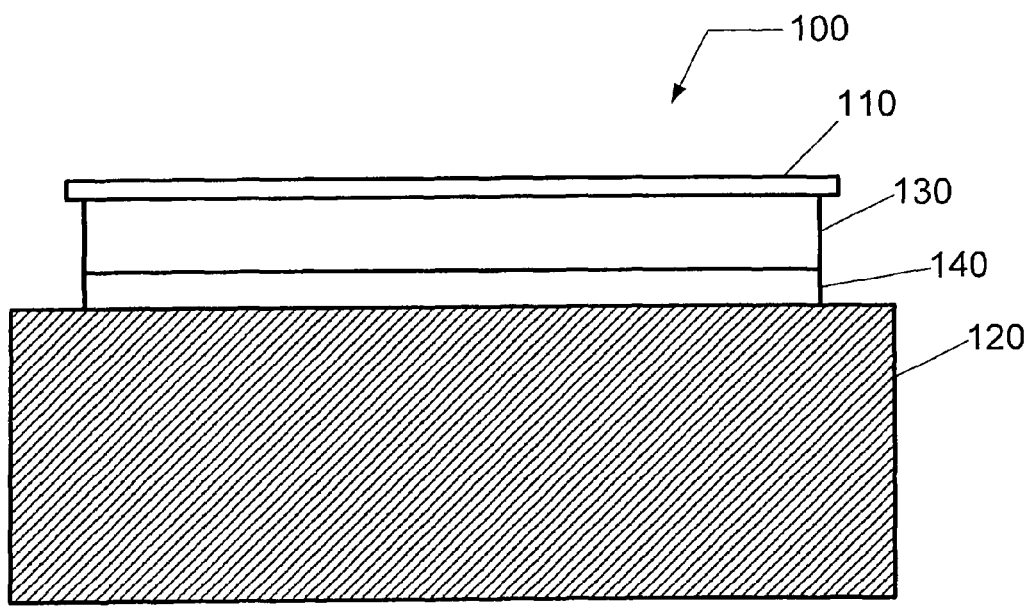
FIG. 2A presents a schematic cross-section view of a substrate holder according to an embodiment of the present invention.

Referring now to FIG. 2A, a substrate holder is described according to one embodiment. The substrate holder 100 comprises a substrate support 130 having a first temperature and configured to support a substrate 110, a temperature-controlled support base 120 positioned below substrate support 130 and configured to be at a second temperature less than the first temperature (e.g. less than a desired temperature of substrate 110), and a thermal insulator 140 disposed between the substrate support 130 and the temperature-controlled support base 120. Additionally, the substrate support 130 comprises one or more heating elements coupled thereto (not shown), and configured to elevate the temperature of the substrate support 130 (e.g. to heat the substrate). It is to be understood that the first temperature may be part of a temperature gradient across the substrate support and the second temperature may be part of a temperature gradient across the temperature controlled base according to embodiments of the invention.

According to one embodiment, the thermal insulator 140 comprises a thermal conductivity lower than the respective thermal conductivities of both the substrate support 130 and the temperature-controlled support base 120. For example, the thermal conductivity of the thermal insulator 140 is less than 1 W/m-K. Desirably, the thermal conductivity of the thermal insulator ranges from approximately 0.05 W/m-K to approximately 0.8 W/m-K and, more desirably, the thermal conductivity of the thermal insulator ranges from approximately 0.2 W/m-K to approximately 0.8 W/m-K.

The thermal insulator 140 can comprise an adhesive made of polymer, plastic or ceramic. The thermal insulator 140 may include an organic or an inorganic material. For example, the thermal insulator 140 can comprise a room-temperature-vulcanizing (RTV) adhesive, a plastic such as a thermoplastic, a resin such as a thermosetting resin or a casting resin (or pourable plastic or elastomer compound), an elastomer, etc. In addition to providing a thermal resistance between the substrate support 130 and the temperature-controlled support base 120, the thermal insulator 140 may provide a bond layer or adhesion layer between the substrate support 130 and the temperature-controlled support base 120.

The thickness and material composition of the thermal insulator 120 should be selected such that, when necessary, adequate radio frequency (RF) coupling between the support base 120 and plasma can be maintained. Furthermore, the thermal insulator 120 should be selected in order to tolerate thermal-mechanical shear driven by thermal gradients and differences in material properties, i.e., coefficient of thermal expansion. For example, the thickness of the thermal insulator 140 can be less than or equal to approximately 10 mm (millimeters), and desirably, the thickness can be less than or equal to approximately 5 mm, i.e., approximately 2 mm or less.

Additionally, the material composition of the thermal insulator 140 is preferably such that it demonstrates erosion resistance to the environment within which it is utilized. For example, when presented with a dry plasma etching environment, the thermal insulator 140 should be resistant to the corrosive etch chemistries used during the etching process, as well as the corrosive cleaning chemistries used during an etch system cleaning process. In many etching chemistries and cleaning chemistries, halogen-containing process gases are utilized including, but not limited to, $Cl_2$, $F_2$, $Br_2$, HBr, HCl, HF, $SF_6$, $NF_3$, $ClF_3$, etc. In these chemistries, particularly cleaning chemistries, it is desirable to produce high concentrations of reactive atomic halogen species, such as atomic fluorine, etc.

According to one embodiment, the thermal insulator 140 comprises an erosion resistant thermal insulator. In one embodiment, the entire thermal insulator is made from the erosion resistant material. Alternatively, only a portion of the thermal insulator 140, such as portions exposed to halogen-containing gas, can include the erosion resistant material. For example, the erosion resistant material may be included only at a peripheral exposed edge of the thermal insulator, while the remaining region of the thermal insulator includes a different material composition selected for providing a desired heat transfer co-efficient.

The erosion resistant thermal insulator can include an acryl-type material, such as an acrylic-based material or an acrylate-based material. Acrylic-based materials and acrylate-based materials can be formed by polymerizing acrylic or methylacrylic acids through a reaction with a suitable catalyst. Table 1 provides data illustrating the dependence of erosion resistance on material composition. For example, data is provided for silicon-containing adhesives, and a series of acrylic/acrylate-containing adhesives (prepared by various vendors X, Y, Z, Q, R & T). The data includes the erosion amount ($mm^3$) as a function of plasma (or RF power on) hours (hr); i.e., $mm^3$/hr. As shown in Table 1, the acrylic/acrylate-containing adhesives exhibit more than an order of magnitude less erosion when subjected to a cleaning plasma (such as a $SF_6$-based plasma).

TABLE 1

| | Silicon type | Acryl type | | | | | |
|---|---|---|---|---|---|---|---|
| | | X | Y | Z | Q | R | T |
| Thickness (mm) | 0.13 | 0.13 | 0.25 | 0.13 | 0.15 | 0.05 | 0.12 |
| Thermal conductivity (W/m-K) | 0.25 | 0.35 | 0.6 | 0.37 | 0.3 | 0.6 | 0.2 |
| Thermal resistance ($E^{-4}$) | 5.2 | 3.7 | 4.2 | 3.5 | 7.5 | 8.3 | 6 |
| Erosion ratio ($mm^3$/hr) | 5.5 | 0.32 | 0.3 | 0.22 | 0.25 | 0.15 | 0 |

According to yet another embodiment, the thermal insulator 140 comprises a non-uniform spatial variation of the heat transfer coefficient ($W/m^2$-K) through the thermal insulator 140 between the temperature controlled support base 120 and the substrate support 130. For example, the heat transfer coefficient can vary in a radial direction between a substantially central region of the thermal insulator 140 (below substrate 110) and a substantially edge region of the thermal insulator 140 (below substrate 110). The spatial variation of the heat transfer coefficient may comprise a non-uniform spatial variation of the thermal conductivity (W/m-K) of the thermal insulator 140, or the spatial variation of the heat transfer coefficient may comprise a non-uniform spatial variation of the thickness of the thermal insulator 140, or both. As used herein, the term "non-uniform spatial variation" of a parameter means a spatial variation of the parameter across an area of the substrate holder that is caused by design rather than inherent minor variations of the parameter across a substrate holder. Further, the term "substantially central region of the thermal insulator" means a region of the thermal insulator that would overlap a center of the substrate if placed on the substrate holder, and the term "substantially edge region of the thermal insulator" means a region of the thermal insulator that would overlap an edge of the substrate if placed on the substrate holder.

Figure 2B:
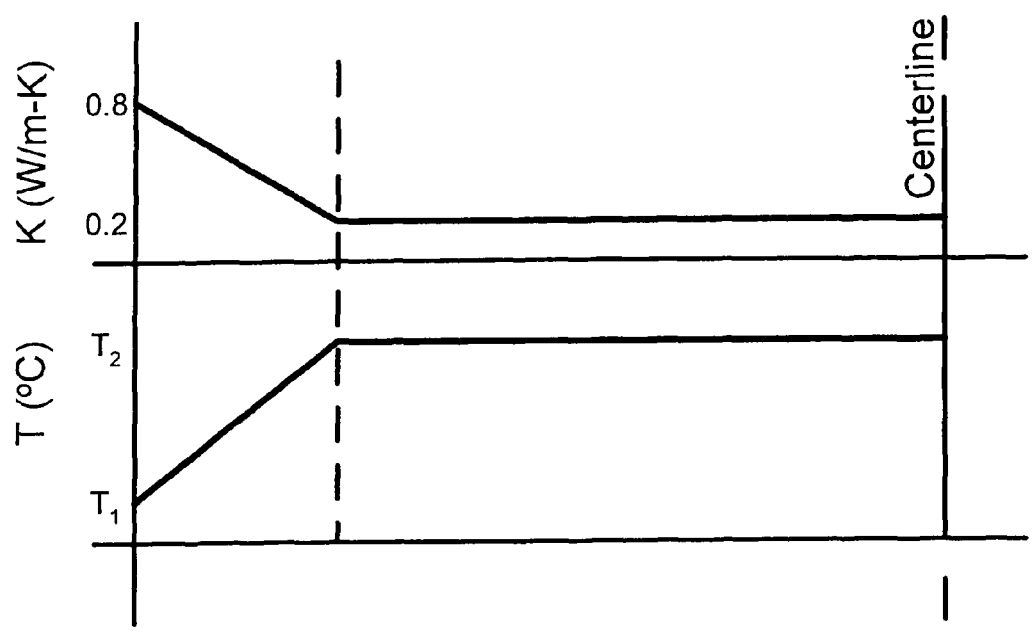
FIG. 2B illustrate exemplary profiles in thermal conductivity and substrate temperature for a substrate holder.

As illustrated in FIG. 2B, the thermal conductivity can vary in a radial direction between a substantially central region of the thermal insulator 140 below substrate 110 and a substantially edge region of the thermal insulator 140 below substrate 110. For example, the thermal conductivity can vary between a first value between approximately 0.2 W/m-K and approximately 0.8 W/m-K and a second value between approximately 0.2 W/m-K and approximately 0.8 W/m-K. Additionally, for example, the thermal conductivity can be approximately 0.2 W/m-K near a substantially central region of the thermal insulator 140 and the thermal conductivity can be approximately 0.8 W/m-K near a substantially edge region of the thermal insulator 140. Additionally yet, for example, the variation in the thermal conductivity substantially occurs between approximately the mid-radius region of the thermal insulator 140 and a substantially peripheral region of the thermal insulator 140. As shown in FIG. 2B, the temperature may vary from center to edge between a first temperature ($T_1$) and a second temperature ($T_2$). Such variations in thermal conductivity (and temperature) may be imposed to counter excessive heating of the peripheral edge of the substrate by, for instance, the focus ring surrounding the substrate.

Figure 3:
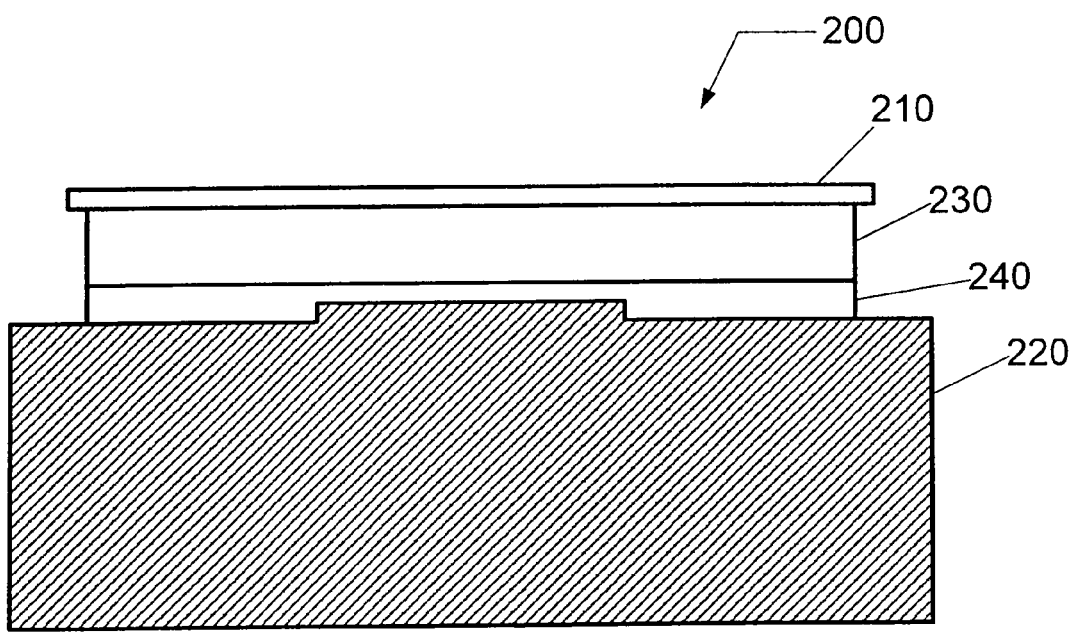
FIG. 3. presents a schematic cross-section view of a substrate holder according to another embodiment of the present invention.

As illustrated in FIG. 3, a substrate holder is described according to another embodiment. The substrate holder 200 comprises a substrate support 230 having a first temperature and configured to support a substrate 210, a temperature-controlled support base 220 positioned below substrate support 230 and configured to be at a second temperature less than the first temperature (e.g. less than a desired temperature of substrate 210), and a thermal insulator 240 disposed between the substrate support 230 and the temperature-controlled support base 220. Additionally, the substrate support 230 comprises one or more heating elements coupled thereto (not shown), and configured to elevate the temperature of the substrate support 230 (e.g. to heat the substrate). The thermal insulator 240 comprises a non-uniform thickness.

As shown, the thickness is less at a substantially center region of the thermal insulator 240 (below substrate 210) and it is relatively thicker at a substantially edge region below the substrate 210. Alternatively, the thickness can be greater at a substantially center region below substrate 210 and it can be relatively thinner at a substantially edge region of substrate 210. The non-uniform thickness of thermal insulator 240 may be imposed by a non-flat upper surface on support base 220, or it may be imposed by a non-flat lower surface of substrate support 240, or it may be imposed by a combination thereof. Alternatively yet, a layer of material having a different thermal conductivity than that of the thermal insulator 240 may be disposed on a portion of either the upper surface of support base 220 or the lower surface of substrate support 230. For instance, a layer of Kapton®, Vespel®, Teflon®, etc., may be disposed on a substantially central region below substrate 210, or such a layer may be disposed on a substantially peripheral region below substrate 210.

Figure 4:
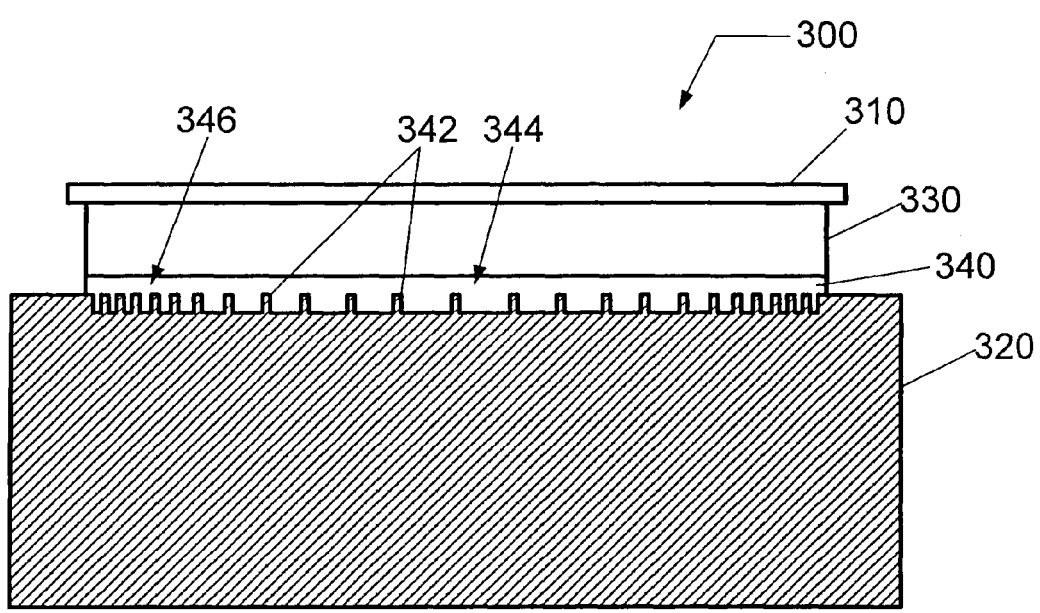
FIG. 4. presents a schematic cross-section view of a substrate holder according to another embodiment of the present invention.

Referring now to FIG. 4, a substrate holder is described according to another embodiment. The substrate holder 300 comprises a substrate support 330 having a first temperature and configured to support a substrate 310, a temperature-controlled support base 320 positioned below substrate support 330 and configured to be at a second temperature less than the first temperature (e.g. less than a desired temperature of substrate 310), and a thermal insulator 340 disposed between the substrate support 330 and the temperature-controlled support base 320. Additionally, the substrate support 330 comprises one or more heating elements coupled thereto (not shown), and configured to elevate the temperature of the substrate support 330.

As shown in FIG. 4, the support base 320 comprises a plurality of protrusions, or ridges 342, that partially extend into (or fully extend through) the thermal insulator 340. Furthermore, the number density of protrusions can vary between a substantially central region 344 and a substantially peripheral region 346 of the substrate holder. For example, a higher density of protrusions may be placed at the peripheral region 346, while a relatively lower density of protrusions may be placed at the central region 344. Alternatively, for example, a lower density of protrusions may be placed at the peripheral region 346, while a relatively higher density of protrusions may be placed at the central region 344. In addition to the variation in density of protrusions, or in lieu of a variation in density, the size or shape or both of the protrusions may be varied.

The temperature controlled support base 120 (220, 320) may be fabricated from a metallic material or a non-metallic material. For example, the support base 120 (220, 320) can be fabricated from aluminum. Additionally, for example, the support base 120 (220, 320) can be formed of a material having a relatively high thermal conductivity, such that the temperature of the support base can be maintained at a relatively constant temperature. The temperature of the temperature controlled support base is preferably actively controlled by one or more temperature control elements such as cooling elements. However, the temperature controlled support may provide passive cooling by use of cooling fins to promote enhanced free convection due to the increased surface area with the surrounding environment for example. The support base 120 (220, 320) can further include passages therethrough (not shown) to permit the coupling of electrical power to the one or more heating elements of the substrate support, the coupling of electrical power to an electrostatic clamping electrode, the pneumatic coupling of heat transfer gas to the backside of the substrate, etc.

The substrate support 130 (230, 330) may be fabricated from a metallic material or a non-metallic material. The substrate support 130 (230, 330) can be fabricated from a non-electrically conductive material, such as a ceramic. For example, substrate support 130 (230, 330) can be fabricated from alumina.

According to one embodiment, the one or more heating elements are embedded within the substrate support 130 (230, 330). The one or more heating elements can be positioned between two ceramic pieces which are sintered together to form a monolithic piece. Alternatively, a first layer of ceramic is thermally sprayed onto the thermal insulator, followed by thermally spraying the one or more heating elements onto the first ceramic layer, and followed by thermally spraying a second ceramic layer over the one or more heating elements. Using similar techniques, other electrodes, or metal layers, may be inserted within the substrate support 130 (230, 330). For example, an electrostatic clamping electrode may be inserted between ceramic layers and formed via sintering or spraying techniques as described above. The one or more heating elements and the electrostatic clamping electrode may be in the same plane or in separate planes, and may be implemented as separate electrodes or implemented as the same physical electrode.

Figure 5:
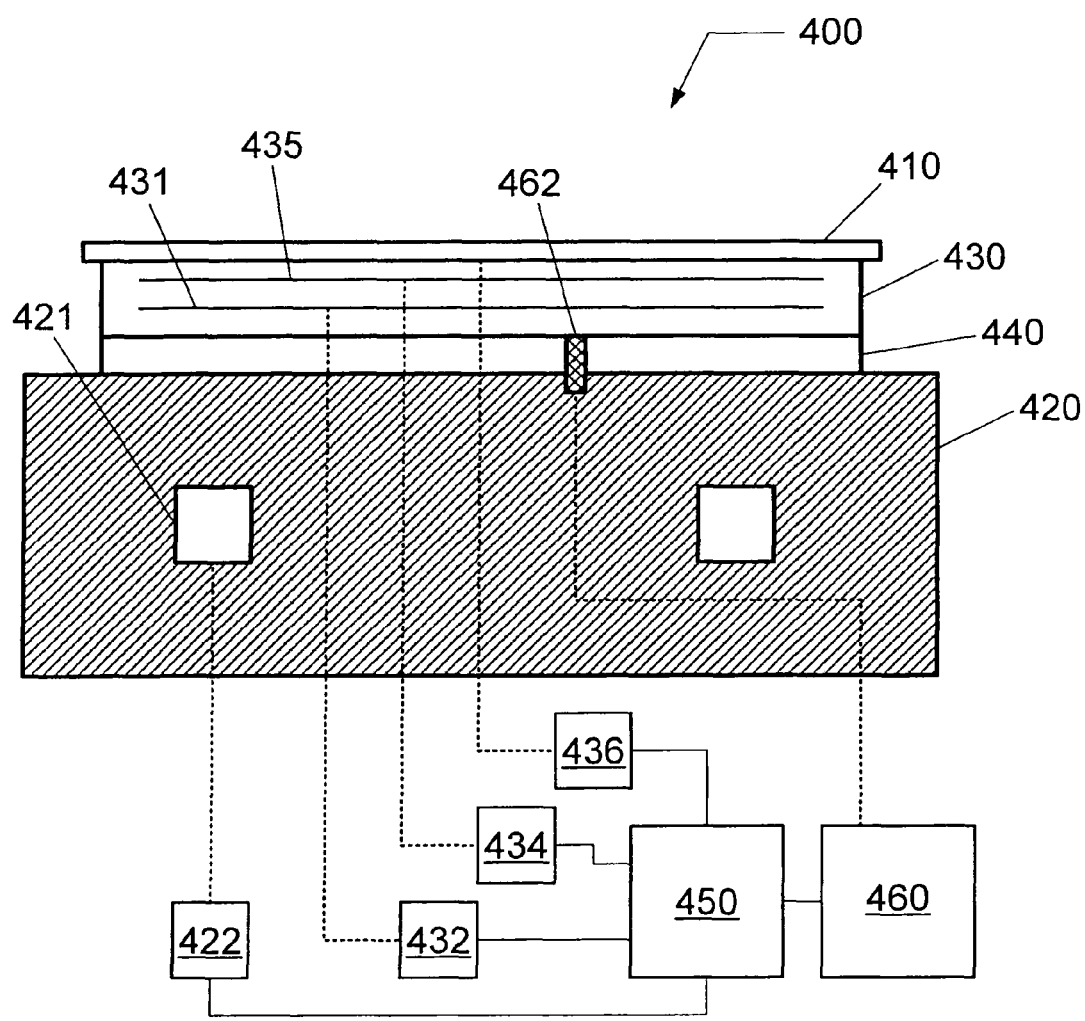
FIG. 5. presents a schematic cross-section view of a substrate holder according to another embodiment of the present invention.

Referring now to FIG. 5, a substrate holder is described according to another embodiment. The substrate holder 400 comprises a substrate support 430 having a first temperature and configured to support a substrate 410, a temperature-controlled support base 420 positioned below substrate support 430 and configured to be at a second temperature less than the first temperature (e.g. less than a desired temperature of substrate 410), and a thermal insulator 440 disposed between the substrate support 430 and the temperature-controlled support base 420. Additionally, the substrate support 430 comprises one or more heating elements 431 coupled thereto, and configured to elevate the temperature of the substrate support 430. Furthermore, the support base 420 comprises one or more cooling elements 421 coupled thereto, and configured to reduce the temperature of the substrate support 430 via the removal of heat from the substrate support 430 through thermal insulator 440.

The one or more heating elements 431 can comprise at least one of a heating fluid channel, a resistive heating element, or a thermo-electric element biased to transfer heat towards the wafer. Furthermore, as shown in FIG. 5, the one or more heating elements 431 are coupled to a heating element control unit 432. Heating element control unit 432 is configured to provide either dependent or independent control of each heating element, and exchange information with a controller 450.

For example, the one or more heating elements 431 can comprise one or more heating channels that can permit a flow rate of a fluid, such as water, Fluorinert, Galden HT-135, etc., therethrough in order to provide conductive-convective heating, wherein the fluid temperature has been elevated via a heat exchanger. The fluid flow rate and fluid temperature can, for example, be set, monitored, adjusted, and controlled by the heating element control unit 432.

Alternatively, for example, the one or more heating elements 431 can comprise one or more resistive heating elements such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). For example, the heating elements can comprise a cast-in heater commercially available from Watlow (1310 Kingsland Dr., Batavia, Ill., 60510) capable of a maximum operating temperature of 400 to 450 C., or a film heater comprising aluminum nitride materials that is also commercially available from Watlow and capable of operating temperatures as high as 300 C and power densities of up to 23.25 W/cm$^2$. Additionally, for example, the heating element can comprise a silicone rubber heater (1.0 mm thick) capable of 1400 W (or power density of 5 W/in$^2$). When an electrical current flows through the filament, power is dissipated as heat, and, therefore, the heating element control unit 432 can, for example, comprise a controllable DC power supply. A further heater option, suitable for lower temperatures and power densities, are Kapton heaters, consisted of a filament embedded in a Kapton (e.g. polyimide) sheet, marketed by Minco, Inc., of Minneapolis, Minn.

Alternately, for example, the one or more heating elements 431 can comprise an array of thermo-electric elements capable of heating or cooling a substrate depending upon the direction of electrical current flow through the respective elements. Thus, while the elements 431 are referred to as "heating elements," these elements may include the capability of cooling in order to provide rapid transition between temperatures. Further, heating and cooling functions may be provided by separate elements within the substrate support 430. An exemplary thermo-electric element is one commercially available from Advanced Thermoelectric, Model ST-127-1.4-8.5M (a 40 mm by 40 mm by 3.4 mm thermo-electric device capable of a maximum heat transfer power of 72 W). Therefore, the heating element control unit 432 can, for example, comprise a controllable current source.

The one or more cooling elements 421 can comprise at least one of a cooling channel, or a thermo-electric element. Furthermore, as shown in FIG. 5, the one or more cooling elements 421 are coupled to a cooling element control unit 422. Cooling element control unit 422 is configured to provide either dependent or independent control of each cooling element 421, and exchange information with controller 450.

For example, the one or more cooling elements 421 can comprise one or more cooling channels that can permit a flow rate of a fluid, such as water, Fluorinert, Galden HT-135, etc., therethrough in order to provide conductive-convective cooling, wherein the fluid temperature has been lowered via a heat exchanger. The fluid flow rate and fluid temperature can, for example, be set, monitored, adjusted, and controlled by the cooling element control unit 422. Alternately, during heating for example, the fluid temperature of the fluid flow through the one or more cooling elements 421 may be increased to complement the heating by the one or more heating elements 431. Alternately yet, during cooling for example, the fluid temperature of the fluid flow through the one or more cooling elements 421 may be decreased.

Alternately, for example, the one or more cooling elements 421 can comprise an array of thermo-electric elements capable of heating or cooling a substrate depending upon the direction of electrical current flow through the respective elements. Thus, while the elements 421 are referred to as "cooling elements," these elements may include the capability of heating in order to provide rapid transition between temperatures. Further, heating and cooling function may be provided by separate elements within the temperature controlled support base 420. An exemplary thermo-electric element is one commercially available from Advanced Thermoelectric, Model ST-127-1.4-8.5M (a 40 mm by 40 mm by 3.4 mm thermo-electric device capable of a maximum heat transfer power of 72 W). Therefore, the cooling element control unit 422 can, for example, comprise a controllable current source.

Additionally, as shown in FIG. 5, the substrate holder 400 can further comprise an electrostatic clamp (ESC) comprising one or more clamping electrodes 435 embedded within substrate support 430. The ESC further comprises a high-voltage (HV) DC voltage supply 434 coupled to the clamping electrodes 435 via an electrical connection. The design and implementation of such a clamp is well known to those skilled in the art of electrostatic clamping systems. Furthermore, the HV DC voltage supply 434 is coupled to controller 450 and is configured to exchange information with controller 450.

Furthermore, as shown in FIG. 5, the substrate holder 400 can further comprise a back-side gas supply system 436 for supplying a heat transfer gas, such as an inert gas including helium, argon, xenon, krypton, a process gas, or other gas including oxygen, nitrogen, or hydrogen, to the backside of substrate 410 through at least one gas supply line, and at least one of a plurality of orifices and channels (not shown). The backside gas supply system 436 can, for example, be a multi-zone supply system such as a two-zone (center/edge) system, or a three-zone (center/mid-radius/edge), wherein the backside pressure can be varied in a radial direction from the center to edge. Furthermore, the backside gas supply system 436 is coupled to controller 450 and is configured to exchange information with controller 450.

Further yet, as shown in FIG. 5, the substrate holder 400 can further comprise one or more temperature sensors 462 coupled to a temperature monitoring system 460. The one or more temperature sensors 462 can be configured to measure the temperature of substrate 410, or the one or more temperature sensors 462 can be configured to measure the temperature of substrate support 430, or both. For example, the one or more temperature sensors 410 may be positioned such that the temperature is measured at the lower surface of the substrate support 430 as shown in FIG. 5, or positioned such that the temperature of a bottom of the substrate 410 is measured.

The temperature sensor can include an optical fiber thermometer, an optical pyrometer, a band-edge temperature measurement system as described in pending U.S. patent application Ser. No. 10/168,544, filed on Jul. 2, 2002, the contents of which are incorporated herein by reference in their entirety, or a thermocouple (as indicated by the dashed line) such as a K-type thermocouple. Examples of optical thermometers include: an optical fiber thermometer commercially available from Advanced Energies, Inc., Model No. OR2000F; an optical fiber thermometer commercially available from Luxtron Corporation, Model No. M600; or an optical fiber thermometer commercially available from Takaoka Electric Mfg., Model No. FT-1420.

The temperature monitoring system 460 can provide sensor information to controller 450 in order to adjust at least one of a heating element, a cooling element, a backside gas supply system, or an HV DC voltage supply for an ESC either before, during, or after processing.

Controller 450 includes a microprocessor, memory, and a digital I/O port (potentially including D/A and/or A/D converters) capable of generating control voltages sufficient to communicate and activate inputs to substrate holder 400 as well as monitor outputs from substrate holder 400. As shown in FIG. 5, controller 450 can be coupled to and exchange information with heating element control unit 432, cooling element control unit 422, HV DC voltage supply 434, backside gas supply system 436, and temperature monitoring system 460. A program stored in the memory is utilized to interact with the aforementioned components of substrate holder 400 according to a stored process recipe. One example of controller 450 is a DELL PRECISION WORKSTATION 640™, available from Dell Corporation, Austin, Tex.

The controller 450 may also be implemented as a general purpose computer, processor, digital signal processor, etc., which causes a substrate holder to perform a portion or all of the processing steps of the invention in response to the controller 450 executing one or more sequences of one or more instructions contained in a computer readable medium. The computer readable medium or memory is configured to hold instructions programmed according to the teachings of the invention and can contain data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read.

Controller 450 may be locally located relative to the substrate holder 400, or it may be remotely located relative to the substrate holder 400 via an internet or intranet. Thus, controller 450 can exchange data with the substrate holder 400 using at least one of a direct connection, an intranet, or the internet. Controller 450 may be coupled to an intranet at a customer site (i.e., a device maker, etc.), or coupled to an intranet at a vendor site (i.e., an equipment manufacturer). Furthermore, another computer (i.e., controller, server, etc.) can access controller 450 to exchange data via at least one of a direct connection, an intranet, or the internet.

Optionally, substrate holder 400 can include an electrode through which RF power is coupled to plasma in a processing region above substrate 410. For example, support base 420 can be electrically biased at an RF voltage via the transmission of RF power from an RF generator through an impedance match network to substrate holder 400. The RF bias can serve to heat electrons to form and maintain plasma, or bias substrate 410 in order to control ion energy incident on substrate 410, or both. In this configuration, the system can operate as a reactive ion etch (RIE) reactor, where the chamber and upper gas injection electrode serve as ground surfaces. A typical frequency for the RF bias can range from 1 MHz to 100 MHz and is preferably 13.56 MHz.

Alternately, RF power can be applied to the substrate holder electrode at multiple frequencies. Furthermore, an impedance match network can serve to maximize the transfer of RF power to plasma in the processing chamber by minimizing the reflected power. Various match network topologies (e.g., L-type, π-type, T-type, etc.) and automatic control methods can be utilized.

Figure 6:
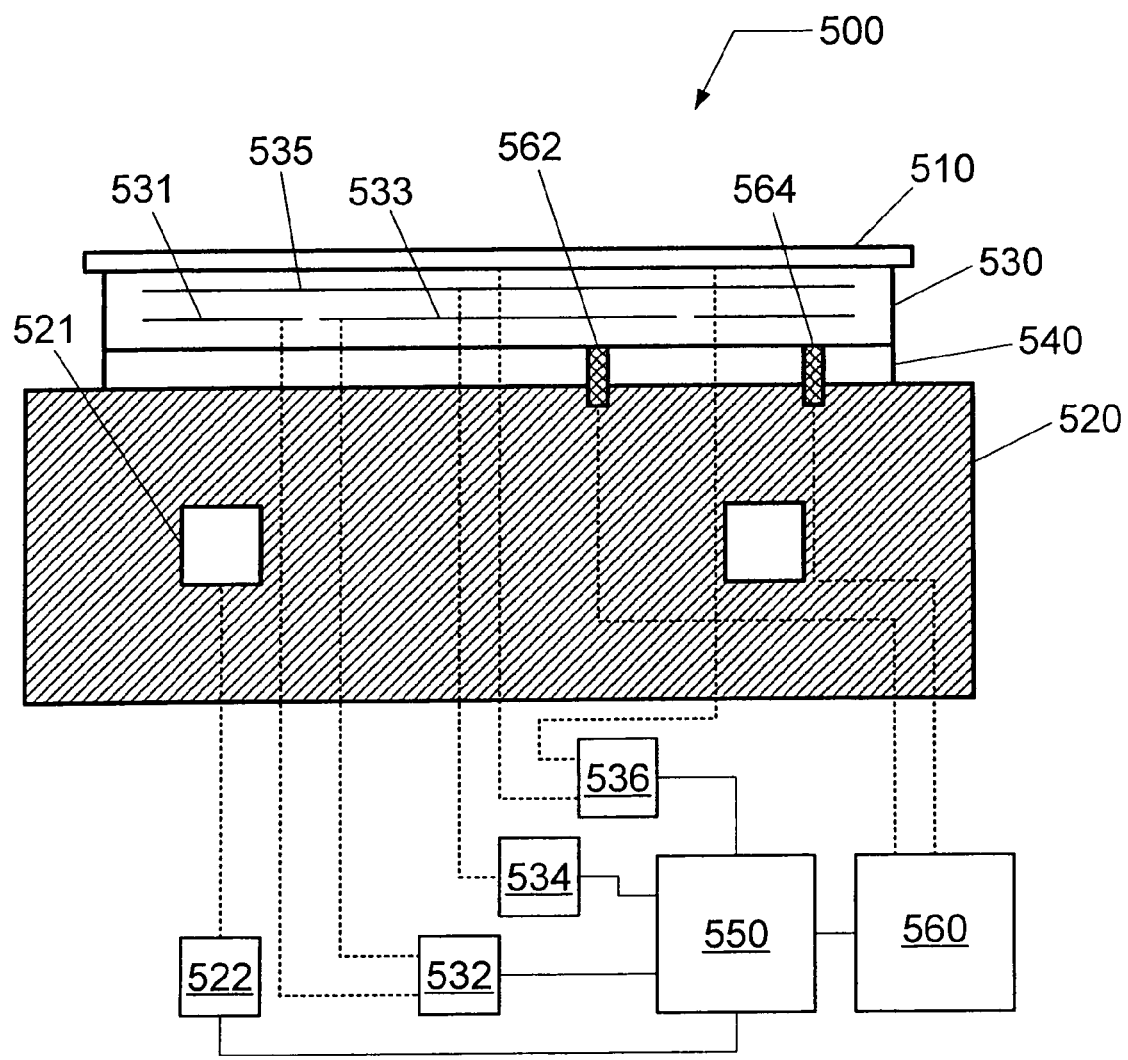
FIG. 6. presents a schematic cross-section view of a substrate holder according to another embodiment of the present invention.

Referring now to FIG. 6, a substrate holder is described according to another embodiment. The substrate holder 500 comprises a substrate support 530 having a first temperature and configured to support a substrate 510, a temperature-controlled support base 520 positioned below substrate support 530 and configured to be at a second temperature less than the first temperature (e.g. less than a desired temperature of substrate 510), and a thermal insulator 540 disposed between the substrate support 530 and the temperature-controlled support base 520. Additionally, the substrate support 530 comprises a center heating element 533 (located at a substantially center region below substrate 510) and an edge heating element 531 (located at a substantially edge, or peripheral, region below substrate 510) coupled thereto, and configured to elevate the temperature of the substrate support 530. Furthermore, the support base 520 comprises one or more cooling elements 521 coupled thereto, and configured to reduce the temperature of the substrate support 530 via the removal of heat from the substrate support 530 through thermal insulator 540.

As shown in FIG. 6, the center heating element 533 and the edge heating element 531 are coupled to a heating element control unit 532. Heating element control unit 532 is configured to provide either dependent or independent control of each heating element, and exchange information with a controller 550.

Additionally, as shown in FIG. 6, the substrate holder 500 can further comprise an electrostatic clamp (ESC) comprising one or more clamping electrodes 535 embedded within substrate support 530. The ESC further comprises a high-voltage (HV) DC voltage supply 534 coupled to the clamping electrodes 535 via an electrical connection. The design and implementation of such a clamp is well known to those skilled in the art of electrostatic clamping systems. Furthermore, the HV DC voltage supply 534 is coupled to controller 550 and is configured to exchange information with controller 550.

Furthermore, as shown in FIG. 6, the substrate holder 500 can further comprise a back-side gas supply system 536 for supplying a heat transfer gas, such as an inert gas including helium, argon, xenon, krypton, a process gas, or other gas including oxygen, nitrogen, or hydrogen, to the center region and the edge region of the backside of substrate 510 through two gas supply lines, and at least two of a plurality of orifices and channels (not shown). The backside gas supply system 536, as shown, comprises a two-zone (center/edge) system, wherein the backside pressure can be varied in a radial direction from the center to edge. Furthermore, the backside gas supply system 536 is coupled to controller 550 and is configured to exchange information with controller 550.

Further yet, as shown in FIG. 6, the substrate holder 500 further comprises a center temperature sensor 562 for measuring a temperature at a substantially center region below substrate 510 and an edge temperature sensor 564 for measuring a temperature at a substantially edge region below substrate 510. The center and edge temperature sensors 562, 564 are coupled to a temperature monitoring system 560.

Figure 8:
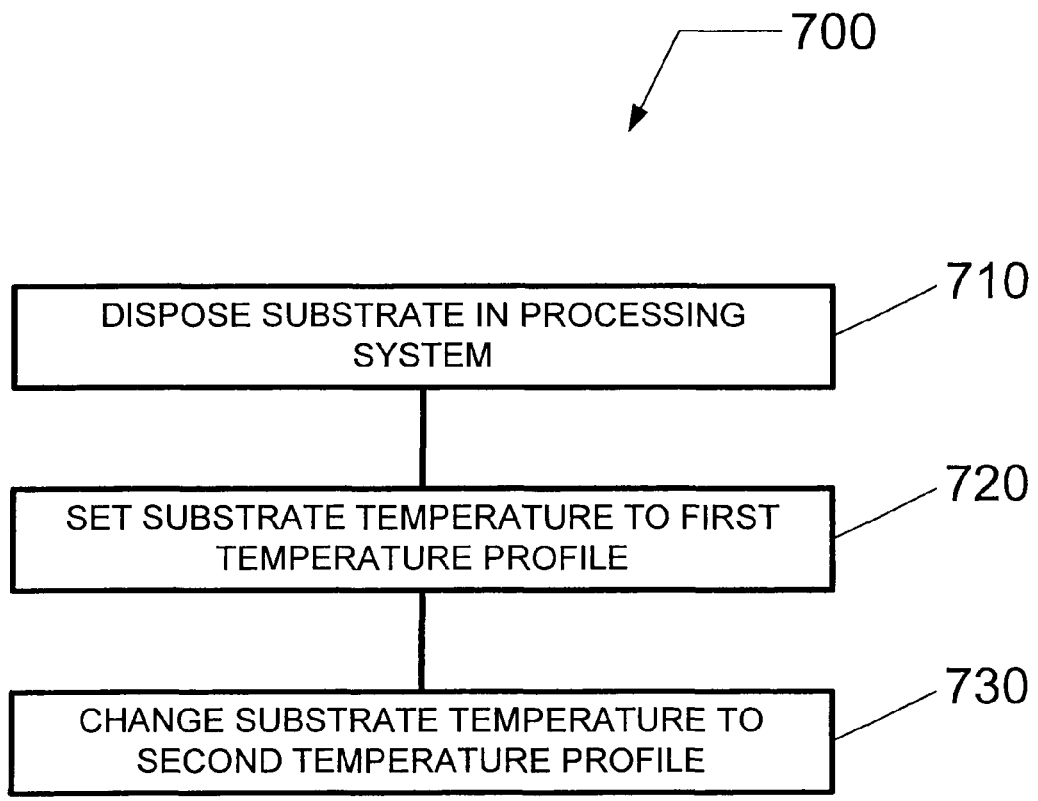
FIG. 8 illustrates a flow chart of a method of adjusting a substrate temperature according to an embodiment of the present invention.

Referring now to FIG. 8, a flowchart describing a method 700 of controlling the temperature of a substrate on a substrate holder in a processing system is presented according to another embodiment. For example, the temperature control scheme can pertain to multiple process steps for a process in a processing system having a substrate holder such as one of those described in FIGS. 1 through 6. The method 700 begins in 710 with disposing a substrate on a substrate holder.

The substrate holder comprises a plurality of temperature sensors reporting at least a temperature at an inner region and an outer region of the substrate and/or substrate holder. Additionally, the substrate holder comprises a substrate support having a first heating element and a second heating element heating the inner region and the outer region respectively, and a support base having a cooling element for cooling the inner region and the outer region. The first and second heating elements and the cooling element are controlled by a temperature control system to maintain the substrate holder at a selectable set-point temperature. Furthermore, the substrate holder comprises a thermal insulator disposed between the substrate support and the support base.

In 720, the substrate is set to a first temperature profile. Using the temperature control system, a first base temperature for the base support (that is less than the first temperature profile (e.g. the substrate temperature), and a first inner set-point temperature and a first outer set-point temperature are selected. Thereafter, the temperature control system adjusts the cooling element and the first and second heating elements to achieve the selected temperatures described above.

In 730, the substrate is set to a second temperature profile. Using the temperature control system, a second base temperature for the base support, and a second inner set-point temperature and a second outer set-point temperature are selected. Thereafter, the temperature control system changes the substrate temperature from the first temperature profile (i.e., first inner and outer set-point temperatures) to the second temperature profile (i.e., second inner and outer set-point temperatures) by optionally adjusting the cooling element to change the first base temperature to the second base temperature and adjusting the inner and outer heating elements until the second inner and outer set-point temperatures are achieved.

In one example, the substrate temperature is increased (or decreased) from the first temperature profile to the second temperature profile, while the second base temperature remains the same as the first base temperature. The power delivered to the inner and outer heating elements is increased (or decreased) in order to heat (or cool) the substrate from the first temperature profile to the second temperature profile.

In another example, the substrate temperature is increased (or decreased) from the first temperature profile to the second temperature profile, while the second base temperature is changed to a value different from the first base temperature. The power delivered to the inner and outer heating elements is increased (or decreased) in order to heat (or cool) the substrate from the first temperature profile to the second temperature profile, while the power delivered to the cooling element is increased (or decreased) in order to change the first base temperature to the second base temperature. Thus, according to one embodiment of the invention, the temperature of the support base is varied to assist the substrate support in controlling the temperature of the substrate. The present inventors have recognized that this varying of the support base temperature can provide more accurate and/or rapid temperature transitions of the substrate.

The temperature control system utilizes a control algorithm in order to stably adjust temperature(s) in response to measured values provided by the temperature monitoring system. The control algorithm can, for example, include a PID (proportional, integral and derivative) controller. In a PID controller, the transfer function in the s-domain (i.e., Laplacian space) can be expressed as:

$$G_c(s) = K_P + K_D s + K_I s^{-1}, \quad (1)$$

where $K_P$, $K_D$, and $K_I$ are constants, referred to herein as a set of PID parameters. The design challenge for the control algorithm is to select the set of PID parameters to achieve the desired performance of the temperature control system.

Figure 7A:
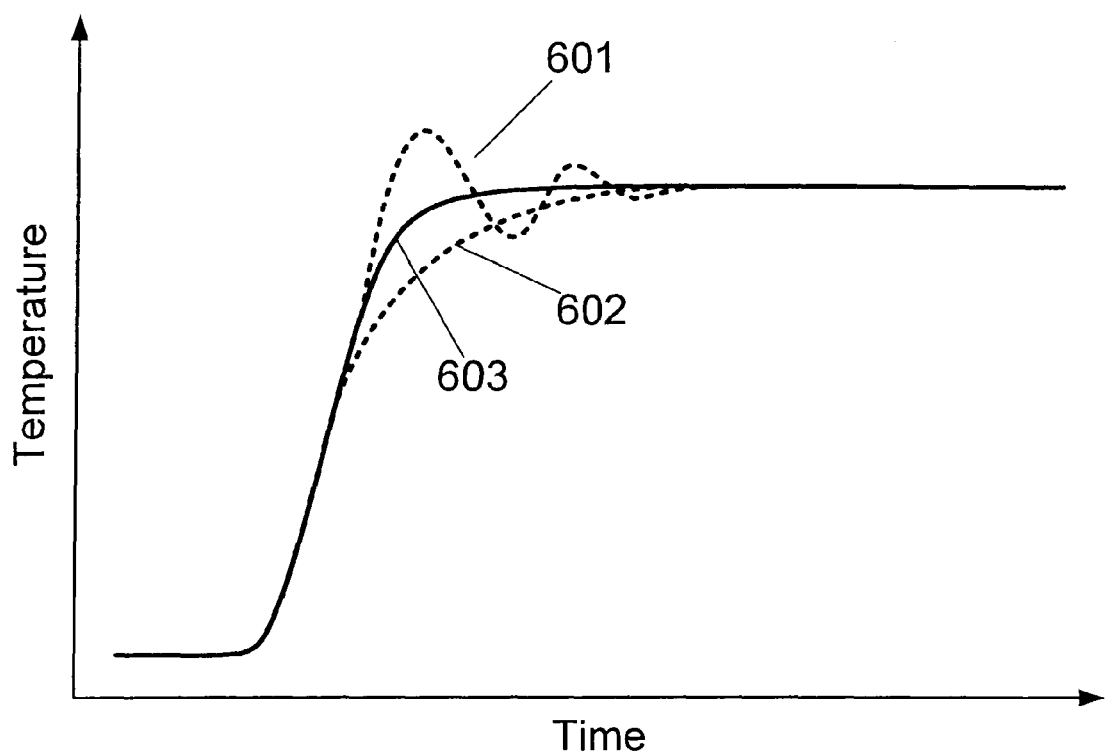
FIGS. 7A and 7B illustrate exemplary time traces of temperature.

Referring to FIG. 7A, several exemplary time traces of temperature are shown to illustrate how different sets of PID parameters lead to a different temperature response. In each case, the temperature is increased from a first value to a second value. A first time trace of temperature 601 illustrates a relatively aggressive control scheme having a relatively low value for $K_P$, for example, wherein the time trace exhibits "overshoot" and a series of oscillations following the overshoot. A second time trace of temperature 602 illustrates a relatively less aggressive control scheme having a relatively higher value for $K_P$, for example, wherein the time trace exhibits a relatively slow, gradual increase to the second temperature. A third time trace of temperature 603 illustrates a desired moderately aggressive control scheme having a value for $K_I$ between that of time trace 601 and time trace 602, for example, wherein the time trace exhibits a relatively faster increase to the second temperature without overshoot. However, the present inventors have recognized that the use of only one PID parameter set is not sufficient to provide a desired condition for stability and rise rate.

Figure 7B:
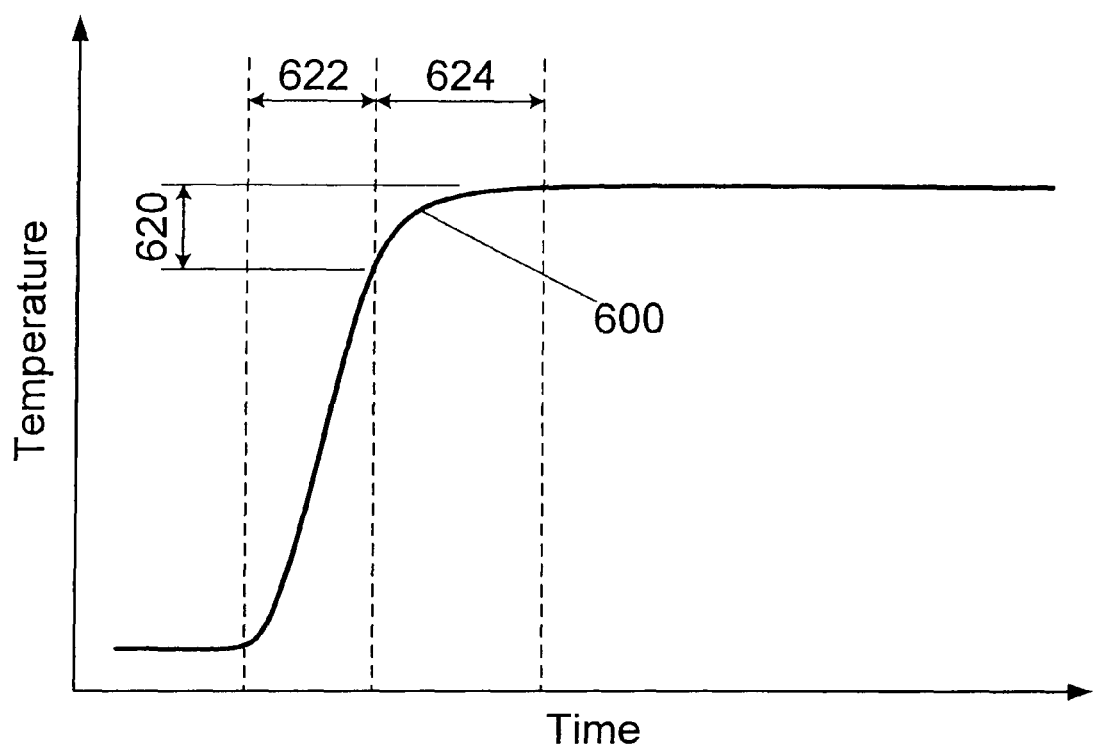

According to one embodiment, two or more PID parameter sets are utilized to achieve a rapid and stable adjustment of the temperature between an initial value and a final value. FIG. 7B illustrates an exemplary time trace of temperature 600 utilizing two sets of PID parameters. A first set of PID parameters is used for a first time duration 622, and a second set of PID parameters is used for a second time duration 624. The first time duration 622 can be determined by setting a temperature offset 620 from the final value of the temperature. For example, the temperature offset can range from approximately 50% to 99% of the temperature difference between the initial value and the final value. Additionally, for example, the temperature offset can range from approximately 70% to 95% of the temperature difference between the initial value and the final value, and desirably, the temperature offset can range from approximately 80% to 95%.

For example, a relatively aggressive RID parameter set may be used for the first time duration 622, while a relatively less aggressive PID parameter set may be used for the second time duration 624. Alternatively, for example, the PID parameter $K_D$ can be increased from the first PID set to the second PID set, the PID parameter $K_I$ can be decreased from the first PID set to the second PID set, or a combination thereof.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A substrate holder for supporting a substrate in a processing system, comprising:
   a support base having fluid channels to circulate a temperature controlled thermal fluid in said support base;
   a substrate support coupled via a thermal insulator to an upper portion of said support base, said substrate support comprising:
   a plurality of heating elements embedded within said substrate support,
   an upper surface to support the substrate by contact between said upper surface and a backside of the substrate, and;
   an electrostatic clamp electrode to hold the substrate on said upper surface of said substrate support; and
   at least two temperature sensors disposed in the substrate holder to measure a temperature of said substrate support, a temperature of the substrate contacting said substrate support, or a temperature of both said substrate support and said substrate contacting said substrate support, the at least two temperature sensors comprising:
      a central temperature sensor to measure a temperature of a substantially central region of the substrate and a temperature beneath the substantially central region of substrate, and
      an edge temperature sensor to measure a temperature of a substantially edge region of the substrate and a temperature beneath the substantially edge region of the substrate, wherein the central and edge temperature sensors are each coupled to a temperature monitoring system,
   wherein said support base, said substrate support and said at least two temperature sensors include a feature to provide coupling to a control system such that a temperature of said plurality of heating elements in said substrate support and a temperature of the temperature controlled fluid in said support base are adjusted based on a measured temperature of said at least two temperature sensors during each processing step of a multiple step process.

2. The substrate holder according to claim 1, wherein said heating elements comprising resistive heating elements.

3. The substrate holder according to claim 1, wherein said heating elements comprising heating channels.

4. The substrate holder according to claim 1, further comprising a heating element control unit dedicated to controlling said plurality of heating elements, wherein a temperature setting of said plurality of heating elements is independently performed by said heating element control unit to generate a temperature gradient over a surface of the substrate.

5. The substrate holder according to claim 4, further comprising a backside gas supply system to supply a heat transfer gas to the backside of the substrate through orifices disposed on said upper surface of said substrate support.

6. The substrate holder according to claim 5, wherein said orifices of said backside gas supply system are arranged in a plurality of zones on said upper surface of said substrate support to vary a backside pressure in a radial direction between a substantially central region of said backside of the substrate and a substantially edge region of said backside of the substrate.

7. The substrate holder according to claim 6, wherein each of said plurality of zones corresponds to a different temperature zone of said upper surface of the substrate support, each temperature zone having a different temperature.

8. The substrate holder according to claim 5, wherein said temperature monitoring system is configured to provide temperature sensor information to said heating elements or said backside gas supply system before, during, and after the processing steps of the multiple step process.

9. The substrate holder according to claim 8, further comprising a backside gas flow control unit for said backside gas supply system, wherein said heating element control unit, said backside gas flow control unit and said temperature monitoring system are operatively coupled to exchange information.

10. The substrate holder according to claim 9, wherein said heating element control unit and backside gas flow control unit exchange information in each of the processing steps performed according to a process recipe.

11. The substrate holder of claim 1, wherein said thermal insulator includes a non-uniform spatial variation of a thermal conductivity thereof.

12. The substrate holder of claim 1, wherein said thermal insulator includes a non-uniform spatial variation of a thickness thereof.

13. The substrate holder of claim 1, wherein said substrate support is a stack of ceramic layers stacked on each other with said heating elements being disposed between the ceramic layers and sintered together.

14. The substrate holder of claim 1, wherein the substrate support consists of:
   a first ceramic layer having the heating elements thermally sprayed on a surface thereof; and
   a second ceramic layer stacked on said first ceramic layer with said heating elements disposed therebetween.

15. A method for fabricating a semiconductor device, comprising:
   supporting a substrate on a substrate holder with a backside of the substrate in contact with an upper surface of a substrate support of the substrate holder;
   holding the substrate on the upper surface of the substrate support using an electrostatic clamp;
   setting a temperature of a plurality of heating elements embedded within the substrate support;
   setting a temperature of a temperature controlled thermal fluid circulated through fluid channels disposed in a support base of the substrate holder which is coupled to the substrate support via a thermal insulator; and
   iteratively adjusting, during substrate processing, a temperature of the plurality of heating elements and a temperature of the temperature controlled thermal fluid based on a temperature of the substrate or the substrate support measured by a temperature sensor located in the substrate support, wherein said iteratively adjusting comprises independently adjusting the temperature of the plurality of heating elements based on information obtained from a temperature monitoring system which monitors a central temperature sensor and an edge temperature sensor coupled thereto, the central temperature sensor measuring a temperature of a substantially central region of the substrate and a temperature beneath the substantially central region of the substrate, the edge temperature sensor measuring a temperature of a substantially edge region of the substrate and a temperature beneath the substantially edge region of the substrate.

16. The method according to claim 15, wherein said iteratively adjusting comprises adjusting the temperature of the plurality of heating elements and the temperature of the temperature controlled thermal fluid during each processing step according to a process recipe.

17. The method according to claim 15, wherein said iteratively adjusting comprises independently adjusting the temperature of the plurality of heating elements using a control unit dedicated to the heating elements to generate a temperature gradient over a surface of the substrate.

18. A substrate holder for supporting a substrate in a processing system, comprising:
- a support base having fluid channels to circulate a temperature controlled thermal fluid in said support base;
- a substrate support coupled via a thermal insulator to an upper portion of said support base, said substrate support comprising:
  - a plurality of heating elements embedded within said substrate support,
  - an upper surface to support the substrate by contact between said upper surface and a backside of the substrate, and;
  - an electrostatic clamp electrode to hold the substrate on said upper surface of said substrate support;
- at least two temperature sensors disposed in the substrate holder to measure a temperature of said substrate support, a temperature of the substrate contacting said substrate support, or a temperature of both said substrate support and said substrate contacting said substrate support, the at least two temperature sensors comprising:
  - a central temperature sensor to measure a temperature of a substantially central region of the substrate and a temperature beneath the substantially central region of substrate, and
  - an edge temperature sensor to measure a temperature of a substantially edge region of the substrate and a temperature beneath the substantially edge region of the substrate, wherein the central and edge temperature sensors are each coupled to a temperature monitoring system,
- a control system coupled to said support base, said substrate support and said at least two temperature sensors, said control system being configured to control a temperature of said plurality of heating elements in said substrate support and a temperature of the temperature controlled fluid in said support base based on a measured temperature of said at least two temperature sensors during each processing step of a multiple step process.

* * * * *